(12) United States Patent
Dispenza et al.

(10) Patent No.: US 6,865,805 B2
(45) Date of Patent: Mar. 15, 2005

(54) DEVICE AND METHOD OF FORMING A UNITARY ELECTRICALLY SHIELDED PANEL

(75) Inventors: John A. Dispenza, Long Valley, NJ (US); Dipak Thakar, Parlin, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/614,641

(22) Filed: Jul. 7, 2003

(65) Prior Publication Data

US 2004/0035599 A1 Feb. 26, 2004

Related U.S. Application Data

(63) Continuation of application No. 09/808,493, filed on Mar. 14, 2001, now abandoned, which is a division of application No. 09/063,287, filed on Apr. 20, 1998, now abandoned, which is a continuation of application No. 08/988,517, filed on Dec. 10, 1997, now abandoned.

(51) Int. Cl.[7] .................................................. H05K 9/00
(52) U.S. Cl. .............................. 29/848; 29/840; 29/841; 174/35 GC
(58) Field of Search .......................... 29/848, 840, 841, 29/DIG. 29, DIG. 3, 883, 843, 592.1, 527 J, 825; 264/274, 279; 174/35 R, 35 GC

(56) References Cited

U.S. PATENT DOCUMENTS 5,464,578 A * 11/1995 Salter et al. ................. 264/250
6,121,545 A * 9/2000 Peng et al. ............. 174/35 GC

* cited by examiner

Primary Examiner—Dean A. Reichard
Assistant Examiner—Jinhee Lee

(57) ABSTRACT

A device and method of unitarily forming an electrically shielded panel for use in electromagnetically sealing an opening defined in an electronic enclosure. The unitary electrically shielded panel is formed of an electrically non-conductive rigid thermoplastic panel part and a substantially planar, electrically conductive elastomeric gasket bonded together to form the unitary panel in a single tool during a single injection-molding operation.

11 Claims, 4 Drawing Sheets

FIG. 5
FIG. 6
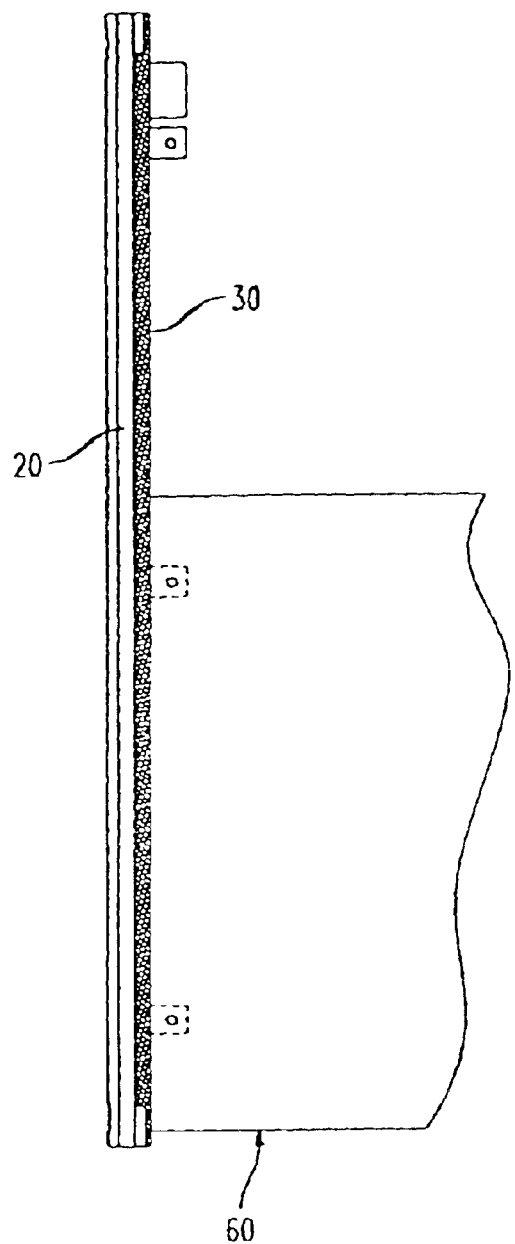
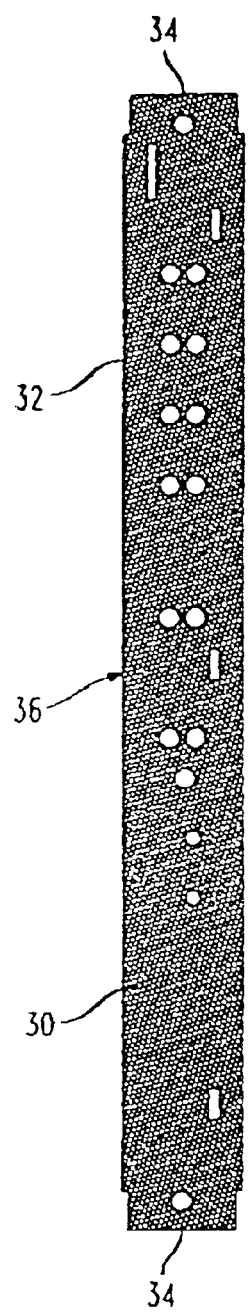

DEVICE AND METHOD OF FORMING A UNITARY ELECTRICALLY SHIELDED PANEL

CROSS REFERENCE TO RELATED APPLICATIONS

This is a continuation of application Ser. No. 09/808,493, filed Mar. 14, 2001 now abandoned, which is a division of application Ser. No. 09/063,287, filed on Apr. 20, 1998 now abandoned, which is a continuation of application Ser. No. 08/988,517, filed Dec. 10, 1997, now abandoned.

BACKGROUND OF THE INVENTION

1. Field of the Invention

The present invention relates to electronic enclosure sealing devices and, more particularly, to a device and method of forming a unitary electrically shielded panel.

2. Description of the Related Art

Electromagnetic interference ("EMI") is often the bane of electronic equipment and circuit designers. Federal regulations mandate that electronic equipment enclosures must not radiate electromagnetic signals that interfere with other proximately located electronic equipment. Electronic equipment enclosures must also be sufficiently shielded against interference from electromagnetic signals radiated from other proximately located equipment. The challenge to designers to control EMI becomes increasingly more difficult as the operating speed of electronic devices increases.

Currently, apertures defined in electronic equipment enclosures are sealed using electrically shielded panels, e.g. circuit-pack faceplates, blank filler panels, covers, doors, etc., that may comprise a separate panel part and gasket. A metallic panel part will function as a conductive shield that spans the enclosure opening to reduce EMI passage therethrough. Here, the gasket need only provide a perimeter seal between the panel part and the enclosure. The panel part may also be non-metallic, in which case a conductive paint or other similar conductive material must be applied to the surface of the panel part that is to receive the gasket. The conductive paint serves as a shield spanning the enclosure opening and the gasket provides a perimeter seal below the panel part and the enclosure. The gasket may be, for example, of metal, a metal-impregnated elastomer, or an elastomer wrapped in a metal sheath, and is affixed to the panel part in a subsequent operation after the panel part is formed. The gasket may be secured to the panel part by friction, adhesive, or by interlocking complementary parts on the panel part and gasket. In other words, fabricating an electrically shielded panel involves at least a two step process: 1) fabricating the panel part; and thereafter 2) affixing a gasket thereto.

U.S. Pat. No. 5,641,438 to Bunyan et al. discloses a method of extruding a fluent electrically conductive polymeric material onto a rigid substrate to form a polymeric EMI gasket thereon. The polymeric material is then cured to produce a bead-like gasket on the substrate. However, the gasket disclosed in this reference is extruded onto the substrate as a secondary operation only after the substrate is fabricated and provides only a perimeter electrical seal.

U.S. Pat. No. 5,524,908 to Reis discloses a multi-layered EMI gasket having first and second electrically conductive layers, with the second layer being more rigid than the first. The second layer must be conductive and generally malleable to permit bending, folding, notching and other forming of the disclosed EMI gasket. The layers may be secured together in a variety of ways including bonding, welding, laminating, or other art recognized affixation methods and techniques—ostensibly as a third step after the layers have been fabricated. However, after the EMI gasket disclosed in this reference is formed, it must then be fastened to or between a substrate or other rigid material before it may be used to electronically seal an enclosure opening.

SUMMARY OF THE INVENTION

The present invention advantageously provides a novel and unobvious device and method of forming a unitary electrically shielded panel that may be used to electrically seal an opening defined in an electronic enclosure to reduce the passage of EMI through the enclosure opening. In accordance with the present invention, the unitary electrically shielded panel is formed of an electrically non-conductive rigid thermoplastic panel part and a substantially planar, electrically conductive elastomeric gasket, i.e. a thermoplastic elastomer, in a single tool during a single injection-molding operation.

In accordance with the method of the present invention, a unitarily formed electrically shielded panel is fabricated using a single tool during a single, two-shot injection-molding operation. A cavity defined within the tool comprises two parts: a first cavity part sized and shaped for forming the rigid panel part; and a second cavity part sized and shaped for forming the gasket. A first shot of the two-shot forming operation injects an electrically non-conductive rigid thermoplastic into the first cavity part to form the rigid panel part while a core is articulatably situated in the second cavity part—the core being substantially the same size and shape as the gasket or the second cavity part. Following the first shot, the core is articulated so as to substantially vacate the second cavity part, and a second shot of the two-shot forming operation injects an electrically conductive elastomer into the second cavity part to form the gasket. The conductive elastomer chemically bonds to and with the electrically non-conductive rigid thermoplastic, thereby forming a unitary electrically shielded panel having an electrically non-conductive rigid thermoplastic panel part and a substantially planar and coextensive electrically conductive gasket unitarily formed therewith.

The present invention is less costly to fabricate, requires no additional assembly, and provides a uniform and reliable EMI seal between the electrically shielded panel and the electronic enclosure. In addition, the panel part and gasket are separable and completely recyclable.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views:

FIG. 5 is a right side view of the shielded panel of FIG. 3 having a circuit-pack attached thereto;

FIG. 6 is a rear face view of the shielded panel of FIG. 3;

DETAILED DESCRIPTION OF THE PRESENTLY PREFERRED EMBODIMENTS

The present invention advantageously provides a novel and unobvious unitarily formed electrically shielded panel that may be used to physically and electromagnetically seal an opening defined in an electronic equipment enclosure to reduce the passage of EMI through the enclosure opening. The present invention also provides a method of forming such a unitary electrically shielded panel. In accordance with the present invention, the unitary shielded panel comprises an electrically non-conductive rigid thermoplastic panel part that is chemically bound to and with a substantially planar, electrically conductive elastomeric shield or gasket, both formed in a single tool or mold during a single injection-molding operation. The terms shield and gasket are used interchangeably herein in describing the substantially planar elastomeric part of the inventive shielded panel.

Figure 1:
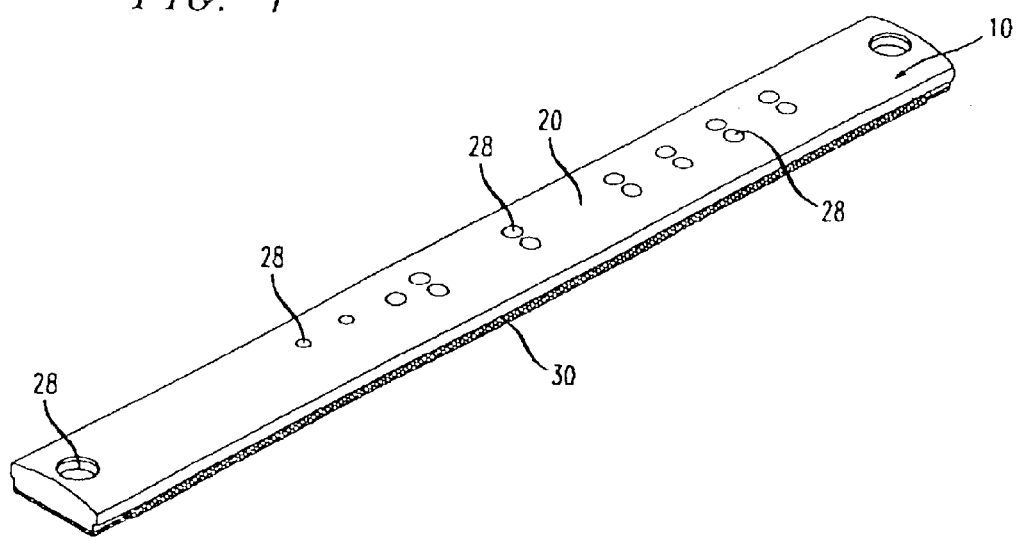
FIG. 1 is a front perspective view of a unitarily formed electrically shielded panel in accordance with the present invention.
Figure 2:
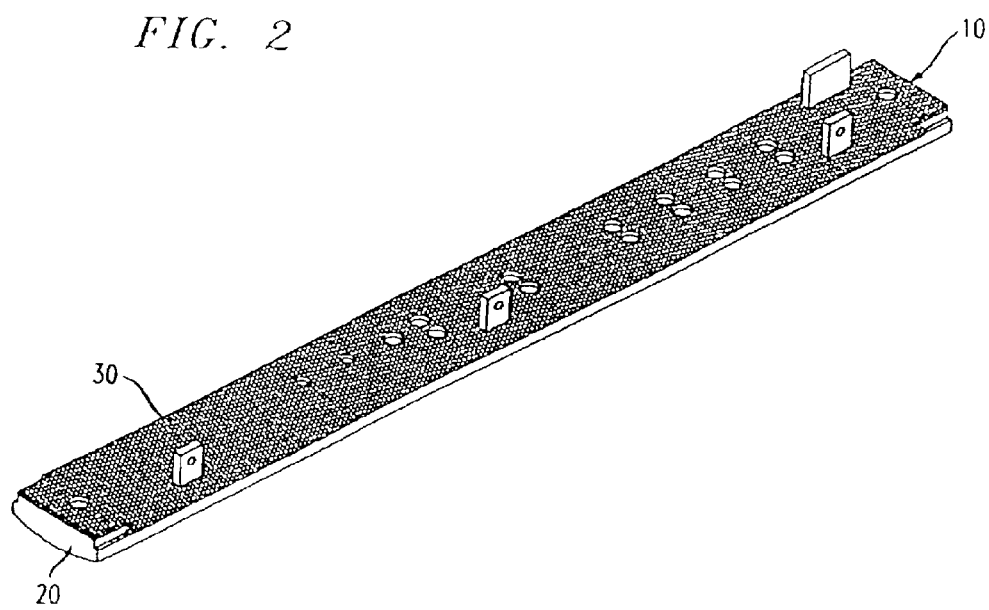
FIG. 2 is a rear perspective view of the shielded panel of FIG. 1.

Referring now to the drawings in detail, FIGS. 1 and 2 depict an electrically shielded panel 10 constructed in accordance with the present invention. As used herein, the term panel is intended to include, by way of non-limiting example, circuit-pack faceplates, blank filler panels, doors, covers, and other similar structure or devices that may be used to cover or seal an opening defined in an electronic equipment enclosure. The present invention applies to unitarily formed electrically shielded panels of virtually any shape and size and is not intended to be limited to the generally rectangular shielded circuit-pack faceplate described herein, which is merely an illustrative example and not intended to define or otherwise limit the scope of the present invention. In addition, the terms electronic equipment enclosure and electronic equipment cabinet are used in their broadest sense to refer generally to structures that contain electronic components, devices, systems, apparatuses, and the like.

Figure 7:
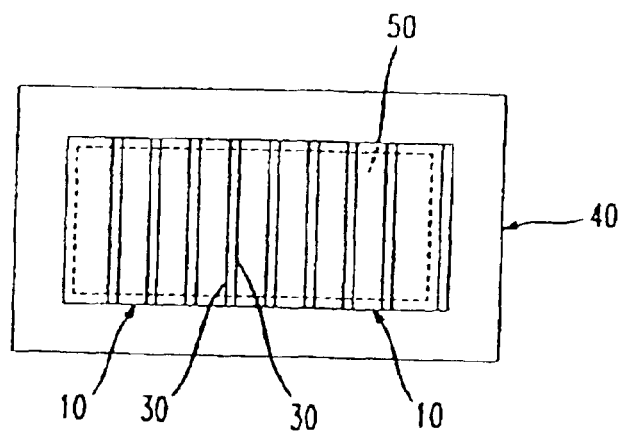
FIG. 7 is a front view of an electronic equipment enclosure having a plurality of electrically shielded panels constructed in accordance with the present invention installed therein.

The unitary electrically shielded panel 10 comprises an electrically non-conductive rigid thermoplastic panel part 20 and a substantially planar, conductive elastomeric shield or gasket 30. The shielded panel 10 is formed in a common or single tool or mold during a single, two-shot injection-molding operation (as described in further detail hereinbelow) during which the panel part 20 and gasket 30 are chemically bonded or bound together concurrent with their formation or fabrication to form the inventive unitary shielded panel 10. The panel part 20 is generally rectangular in shape when viewed straight-on (i.e. from the front as in FIG. 3) and has two substantially parallel peripheral long sides 22 and two substantially parallel peripheral short sides 24—the periphery of the panel part 20 defining a panel part footprint 26 (see, e.g. FIG. 3). When the unitary shielded panel 10 is employed as a circuit-pack faceplate, for example, the panel part 20 and gasket 30 may have a plurality of apertures 28 defined therethrough to accommodate displays (e.g., LEDs) or other visual indicators, switches, and other operative or informative circuit-pack components as well as screws or other fasteners utilized to secure the unitary shielded panel 10 to an enclosure 40 (FIG. 7). It will be apparent to persons skilled in the art that the quantity, size and location of the apertures 28 will depend upon the specific shape and intended application of the shielded panel 10. The panel part 20 and gasket 30 may alternatively comprise substantially solid or continuous parts, devoid of openings, apertures, and the like. Since the inventive shielded panel 10 may be used in various configurations, it will be obvious to a person skilled in the art that the panel part 20 and gasket 30 may include, as a general matter of design choice, apertures, ridges, grooves, tabs, bosses, and numerous other structural features to facilitate use of the panel 10.

The panel part 20 is preferably formed from an electrically nonconductive rigid thermoplastic such, by way of non-limiting example, as polyetherimide (PEI), polysulfone, polycarbonate, or polybutal (PBT), although other thermoplastics are also contemplated by the present invention.

Figure 3:
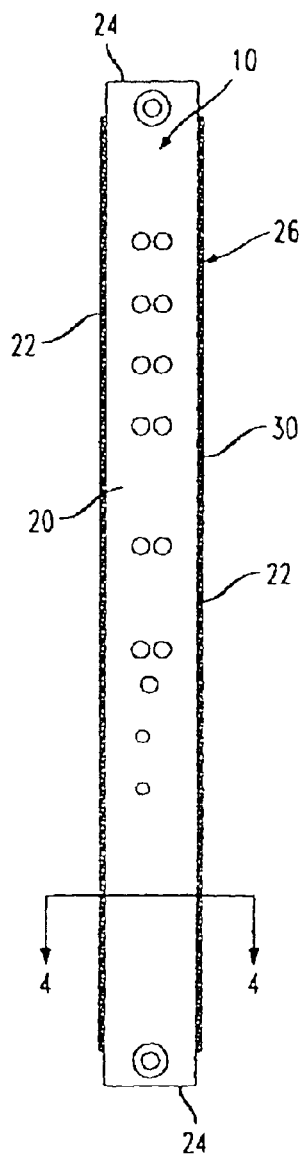
FIG. 3 is a front face view of the shielded panel of FIG. 1.
Figure 4:
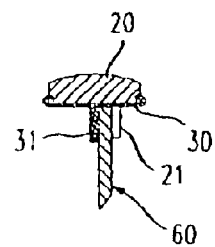
FIG. 4 is a cross-sectional view of the shielded panel of FIG. 3 taken along the lines 4—4 in FIG. 3.

As shown more clearly in FIGS. 2 and 6, the gasket 30 forms a substantially planar and coextensive conductive shield that covers the rear surface of the panel part 20. The gasket 30 is generally rectangular in shape when viewed straight-on (as in FIG. 6) and has a periphery defining a gasket footprint 36 that is, at least in part, peripherally larger than the panel footprint 26. Specifically, the gasket 30 is wider than the panel part 20 preferably over most of its longitudinal length as depicted in FIGS. 3 and 4. Thus, when two or more electrically shielded panels 10 are placed side-by-side, as depicted in FIG. 7, the long sides 32 of the gaskets 30 of immediately adjacent electrically shielded panels 10 abuttingly contact each other so as to provide a physical and electrical seal therebetween—effectively forming a substantially continuous and planar electrical shield for electrically sealing an opening 50 defined in an electronic enclosure 40. The gasket 30 is preferably formed of a thermoplastic elastomer blended with a conductive filler and is sufficiently compatible with the non-conductive thermoplastic panel part 20 to permit the two materials to bond together during formation of the panel 10 in a single tool during a two-slot injection molding process. The compatibility also prevents adverse reaction between the conductive and non-conductive materials during formation and use of the inventive panel 10. The compatibility further ensures sufficient bonding between the dissimilar materials as the panel 10 is fabricated and during the useful life of the panel 10 yet permits their selective separation for recyclability. The materials may be chemically and/or mechanically bonded together—mechanical bonding resulting from the high pressure at which the two materials are processed during formation of the panel 10. Exemplary, non-limiting elastomers include ethylene-propylene-diene-terpolymers and styrene block copolymers. The conductive filler may by way of example comprise a short or long graphite fiber compound or a graphite powder. It will nevertheless be obvious to persons skilled in the art that other electrically conductive elastomers may alternatively be used to form the gasket 30 without departing from the spirit of the present invention.

When the inventive shielded panel 10 is configured as a circuit-pack faceplate, as is depicted for example in the drawings, the rigid panel part 20 will generally include a plurality of mounting tabs 21 that extend substantially perpendicularly outward therefrom. (See, e.g., FIGS. 4 and 5). The gasket 30 may also include a plurality of conductive tabs 31 located near and spaced apart from the mounting tabs 21 and extending generally parallel thereto. In this arrangement, a circuit-pack 60 may be attached to the tabs 21, 31 using any suitable type of art-recognized attachment means or methods for mechanically and electrically attaching the circuit-pack 60 to the shielded panel 10.

Referring next to FIG. 7, an electronic equipment enclosure 40 is depicted having a plurality of electrically shielded panels 10 disposed in adjacent abutting relation to each other so as to provide an electromagnetic barrier or seal over an aperture 50 defined in the enclosure 40. For this illustrative example, the aperture 50 defines the opening through which circuit-packs are operatively inserted into the enclosure 40, although the aperture 50 may alternatively be an access opening in the enclosure 40, a single circuit-pack opening, or any other number of functional openings. The gasket 30 of each electrically shielded panel 10 serves at least three purposes: first, it electrically contactingly engages the electronic enclosure 40 at least along the short sides 34 of the gasket 30; second, it abuttingly contacts the gasket 30 of adjacent electrically shielded panels 10; and third, it provides a substantially planar shield that attenuates or reduces the passage of EMI through the aperture 50. Thus, when a plurality of the inventive panels 10 are installed in the enclosure 40 so as to completely fill the expanse of the aperture 50, the plural panels 10 effectively seal the aperture 50 and substantially block or reduce the passage of EMI therethrough. Consequently, the enclosure 40 radiates less EMI and is less susceptible to EMI radiated by other electronic devices. The plural inventive panels 10 depicted in FIG. 7 and discussed in the illustrative example hereinabove may consist of any combination of circuit-pack faceplates, blank filler panels or covers. Alternatively, a single electrically shielded panel 10 may be sized and shaped to sealingly cover the entire aperture 50.

Figure 8:
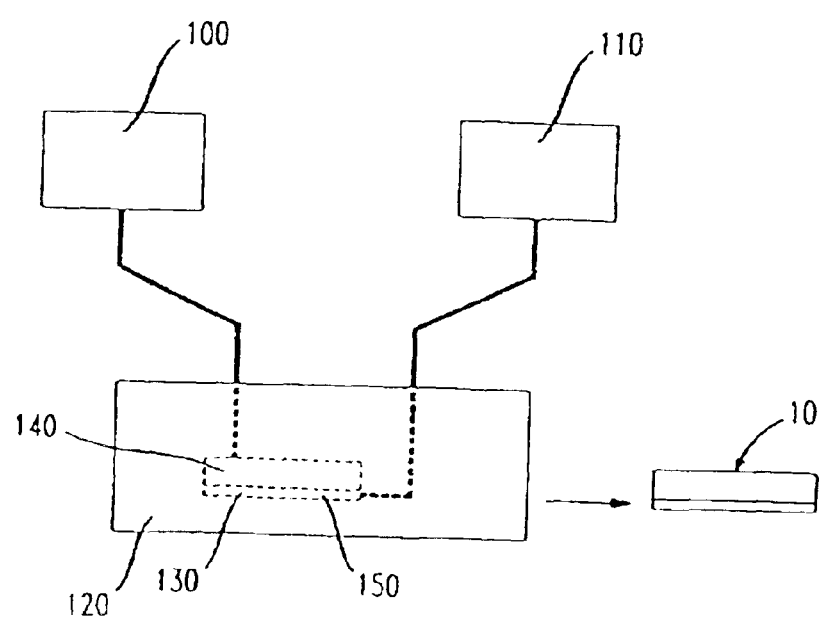
FIG. 8 is a diagrammatic view of a two-shot injection-molding apparatus for forming a unitary electrically shielded panel in accordance with the method of the present invention.

The present invention additionally provides a method of forming, in a common or single tool or mold and during a single injection-molding operation, a unitary electrically shielded panel 10 having a non-electrically conductive rigid thermoplastic panel pan 20 chemically bound to and integrally carrying a substantially planar and coextensive electrically conductive elastomeric shield or gasket 30. As used herein, the term injection-molding includes without limitation gas-assist injection-molding, high-pressure and low-pressure structural foam injection-molding, and other art-recognized thermoplastic and thermoset pressure-based forming methods and processes. The inventive method, diagrammatically depicted by the apparatus of FIG. 8, is preferably a two-shot injection-molding process, although other processes suitable for molding or otherwise forming thermoplastics are also contemplated by and within the scope of the present invention. A tool or mold 120 has a first cavity 140 defined therein in the approximate size and shape of the panel part 20. A second cavity 150 is defined within the tool 120 immediately adjacent the first cavity 140 so that the first and second cavities 140, 150 are relatively positioned in the same manner in which the panel part 20 and gasket 30 are relatively positioned in the completed panel 10, and is preferably the approximate size and shape of the gasket 30. The tool 120 is configured for a two-shot injection-molding process during which a first shot injects an electrically non-conductive rigid thermoplastic 100 into the first cavity 140 to form the rigid panel part 20. After a predetermined time period, i.e. the time required for the thermoplastic 100 to change from a liquid to a solid, a second shot injects an electrically conductive elastomer 110 into the second cavity 150 to form the gasket 30 which bonds to it with the panel part 20 concurrent with its formation in the mold 120. For the preferred thermoplastic (i.e. polyetherimide), the predetermined time period is between approximately 15 and 30 seconds. It will be obvious to persons skilled in the art that the time period required for other thermoplastics to change from a liquid to a solid may vary. During the first shot, an articulatable core 130 is located within the second cavity 150 and preferably conforms to the size and shape of the cavity 150. The core 130 is articulated so as to substantially vacate the second cavity 150 prior to the second shot. The electrically shielded panel 10 produced by the hereindescribed method is an integrated and unitary device comprised of an electrically non-conductive rigid thermoplastic panel part 20 that is chemically joined and bound to and with a substantially planar, electrically conductive elastomeric gasket 30. It is thus possible, according to the present invention, to reliably, quickly and inexpensively fabricate an electromagnetic shield panel.

Both the first and second shot occur during a single forming operation and thus form the inventive electrically shielded panel 10 during a single, two-shot injection-molding process.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. It is the intention, therefore, to be limited only as indicated by the scope of the claims appended hereto.

What is claimed is:

1. A method of forming an electrically shielded panel unitarily formed of an electrically non-conductive rigid part and a substantially planar and coextensive electrically conductive shield, said method comprising the steps of:
   (a) introducing an electrically non-conductive thermoplastic in a flowable state into a first part of a cavity defined in a tool, the tool cavity having a second part having an articulatable core sized and shaped to fit within the second part of the tool cavity and initially disposed therein;
   (b) permitting the electrically non-conductive flowable-state thermoplastic to solidify within the first part of the tool cavity;
   (c) articulating the core so as to remove the core from the second part of the tool cavity; and
   (d) introducing into the second part of the tool cavity an electrically conductive elastomer that bonds with the electrically non-conductive thermoplastic in the first part of the cavity to form a unitary electrically shielded panel having an electrically non-conductive rigid part and a substantially planar and coextensive electrically conductive shield.

2. The method of claim 1, wherein the bond between the electrically conductive elastomer and the electrically non-conductive thermoplastic is at least a chemical bond.

3. The method of claim 1, wherein the bond between the electrically conductive elastomer and the electrically non-conductive thermoplastic is at least a mechanical bond.

4. The method of claim 1, wherein said electrically non-conductive thermoplastic comprises polyetherimide.

5. The method of claim 4, wherein said step (b) further comprises waiting between approximately 15 to 30 seconds for the non-conductive thermoplastic to solidify.

6. The method of claim 1, wherein said step (a) further comprises injecting the electrically non-conductive rigid thermoplastic into the first cavity part under high pressure, and said step (d) further comprises injecting the electrically conductive elastomer into the second cavity part under high pressure.

7. The method of claim 6, wherein said electrically non-conductive thermoplastic comprises polyetherimide.

8. The method of claim 7, where said step (b) further comprises waiting between approximately 15 to 30 seconds for the non-conductive thermoplastic to solidify.

9. The method of claim 1, wherein said step (a) further comprises injecting the electrically non-conductive rigid thermoplastic into the first cavity part under low pressure, and said step (d) further comprises injecting the electrically conductive elastomer into the second cavity party under low pressure.

10. The method of claim 9, wherein said electrically non-conductive thermoplastic comprises polyetherimide.

11. The method of claim 10, where said step (b) further comprises waiting between approximately 15 to 30 seconds for the non-conductive thermoplastic to solidify.

* * * * *